(12) United States Patent
Suzuki et al.

(10) Patent No.: US 9,774,769 B2
(45) Date of Patent: Sep. 26, 2017

(54) MOUNTED ELECTRONIC COMPONENT INCLUDING CONNECTION PORTIONS

(71) Applicant: CANON KABUSHIKI KAISHA, Tokyo (JP)

(72) Inventors: Takanori Suzuki, Tokyo (JP); Koji Tsuduki, Kawasaki (JP); Hisatane Komori, Ayase (JP); Yasushi Kurihara, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 10 days.

(21) Appl. No.: 14/869,768

(22) Filed: Sep. 29, 2015

(65) Prior Publication Data

US 2016/0119564 A1  Apr. 28, 2016

(30) Foreign Application Priority Data

Oct. 23, 2014 (JP) .................................. 2014-216633

(51) Int. Cl.
*H04N 5/225* (2006.01)
*H05K 1/11* (2006.01)
*H05K 3/34* (2006.01)
*H05K 3/46* (2006.01)

(52) U.S. Cl.
CPC ........... *H04N 5/2253* (2013.01); *H05K 1/111* (2013.01); *H05K 1/117* (2013.01); *H05K 3/3442* (2013.01); *H05K 3/4697* (2013.01); *H05K 2201/068* (2013.01); *H05K 2201/094* (2013.01); *H05K 2201/09181* (2013.01); *H05K 2201/09409* (2013.01); *H05K 2201/10151* (2013.01); *Y02P 70/611* (2015.11)

(58) Field of Classification Search
CPC ........... H04N 5/374; H05K 1/181; H05K 1/11
USPC ......................................................... 348/294
See application file for complete search history.

(56) References Cited

U.S. PATENT DOCUMENTS

| 4,523,807 | A | 6/1985 | Suzuki |
| 5,694,330 | A | 12/1997 | Iwamura et al. |
| 6,321,182 | B1 | 11/2001 | Suzuki |
| 7,598,611 | B2 | 10/2009 | Takayama |

(Continued)

FOREIGN PATENT DOCUMENTS

| JP | 2002-198463 A | 7/2002 |
| JP | 2006-060102 A | 3/2006 |

(Continued)

*Primary Examiner* — Antoinette Spinks
(74) *Attorney, Agent, or Firm* — Fitzpatrick, Cella, Harper & Scinto

(57) ABSTRACT

A surface mounted electronic component is provided. The component includes a first and a second connection portion for performing connection to a mounting board. The first connection portion includes a joint region arranged on a lower surface. The second connection portion includes a lower surface region arranged on the lower surface, and a side surface region connected to the lower surface region and arranged on a side surface. In a direction along the side, the lower surface region is arranged apart from the joint region, a length of the lower surface region in the direction is longer than a length of the joint region, a length of the side surface region in the direction is shorter than the length of the lower surface region, and the side surface region is spaced apart from an end of the side surface.

20 Claims, 4 Drawing Sheets

(56) References Cited

U.S. PATENT DOCUMENTS

| | | |
|---|---|---|
| 7,731,904 B2 | 6/2010 | Okamoto et al. |
| 8,110,755 B2 | 2/2012 | Takayama |
| 8,115,267 B2 | 2/2012 | Miura |
| 8,963,327 B2 | 2/2015 | Harada et al. |
| 2003/0218598 A1* | 11/2003 | Shibata ............... G06F 1/1613 345/161 |
| 2009/0045495 A1* | 2/2009 | Takayama ......... H01L 23/49805 257/680 |
| 2010/0267589 A1 | 10/2010 | Okamoto et al. |
| 2012/0050590 A1* | 3/2012 | Suzuki ............. H01L 27/14618 348/294 |
| 2014/0306582 A1 | 10/2014 | Matsuzawa et al. |
| 2015/0118801 A1 | 4/2015 | Harada et al. |
| 2015/0279770 A1 | 10/2015 | Kataoka et al. |

FOREIGN PATENT DOCUMENTS

| | | |
|---|---|---|
| JP | 2008-042064 A | 2/2008 |
| JP | 2009-049071 A | 3/2009 |
| JP | 2010-027965 A | 2/2010 |
| JP | 2010-080577 A | 4/2010 |
| JP | 2010-206158 A | 9/2010 |
| JP | 2010-258330 A | 11/2010 |
| JP | 2011-187546 A | 9/2011 |
| JP | 2013-236039 A | 11/2013 |
| JP | 2014-207313 A | 10/2014 |

\* cited by examiner

MOUNTED ELECTRONIC COMPONENT INCLUDING CONNECTION PORTIONS

BACKGROUND OF THE INVENTION

Field of the Invention

The present invention relates to an electronic component, a module, and a camera.

Description of the Related Art

Surface mounted electronic components include an LGA (Land Grid Array) package, an LCC (Leadless Chip Carrier) package, or the like. The external terminals of such package are joined to a mounting board such as a printed board using solder, which is used as part of an electronic component. Japanese Patent Laid-Open No. 2009-49071 describes an electronic component in which external terminals are arranged on the lower and side surfaces so as to enable surface mounting on a mounting board. In the electronic component described in Japanese Patent Laid-Open No. 2009-49071, the reliability of solder joints to the mounting board is increased by making the lower and side surfaces of terminals arranged at the four corners of the electronic component larger than those of other terminals.

SUMMARY OF THE INVENTION

A stress may occur in solder for connecting an electronic component and a mounting board due to the difference in thermal expansion coefficient between the electronic component and the mounting board, thereby causing a crack. If the lower and side surfaces of the terminals arranged at the four corners are made larger, as in Japanese Patent Laid-Open No. 2009-49071, for the purpose of reinforcing solder on which the stress tends to concentrate, the amount of solder necessary to connect these reinforcing terminals to the mounting board is larger than that used to connect other terminals. Accordingly, the amount of molten solder becomes large in a reflow process for soldering the electronic component to the mounting board. The present inventors found that the molten solder may flow out cross the edges of the reinforcing terminals. Furthermore, if the side surface of the terminal is larger, the amount of solder which enters the side surface from the lower surface and adheres to the side surface becomes larger, and thus the amount of solder coated to the lower surface before the reflow process is larger than an original necessary amount. Consequently, the amount of molten solder further increases and the solder readily flows out. If the solder which has flown out reaches another terminal, a short-circuit failure occurs between the terminal made larger for reinforcement and the other terminal. In addition, if the solder which has flown out is scattered in a manufacturing apparatus, a problem such as contamination of the manufacturing apparatus may arise. Some embodiments of the present invention provide a technique of suppressing a problem which arises when an electronic component is mounted on a mounting board.

According to some embodiments, a surface mounted electronic component including a first connection portion and a second connection portion for performing connection to a mounting board, comprising an upper surface on which an electronic device is mounted; a lower surface located on an opposite side of the upper surface; and side surfaces each configured to share a side with the lower surface, wherein the first connection portion includes a joint region arranged on the lower surface, the second connection portion includes a lower surface region arranged on the lower surface, and a side surface region connected to the lower surface region and arranged on the side surface, the lower surface region is arranged apart from the joint region in a direction along the side, a length of the lower surface region in the direction is longer than a length of the joint region in the direction, a length of the side surface region in the direction is shorter than the length of the lower surface region in the direction, and the side surface region is spaced apart from an end of the side surface in the direction, is provided.

According to some other embodiments, a module comprising: a mounting board; a surface mounted electronic component including a first connection portion and a second connection portion for performing connection to the mounting board; and a solder member, wherein the surface mounted electronic component comprises an upper surface on which an electronic device is mounted; a lower surface located on an opposite side of the upper surface; and side surfaces each configured to share a side with the lower surface, the first connection portion includes a joint region arranged on the lower surface, the second connection portion includes a lower surface region arranged on the lower surface, and a side surface region connected to the lower surface region and arranged on the side surface, the lower surface region is arranged apart from the joint region in a direction along the side, a length of the lower surface region in the direction is longer than a length of the joint region in the direction, a length of the side surface region in the direction is shorter than the length of the lower surface region in the direction, the side surface region is spaced apart from an end of the side surface in the direction, the solder member is configured to connect a first connection portion and a second connection portion of the electronic component to connection portions of a mount surface of the mounting board, and part of the solder member adheres to the side surface region, is provided.

According to some other embodiments, a camera comprising: a surface mounted electronic component including a first connection portion and a second connection portion for performing connection to a mounting board; and a signal processing unit, wherein the surface mounted electronic component comprises an upper surface on which an electronic device is mounted; a lower surface located on an opposite side of the upper surface; and side surfaces each configured to share a side with the lower surface, the first connection portion includes a joint region arranged on the lower surface, the second connection portion includes a lower surface region arranged on the lower surface, and a side surface region connected to the lower surface region and arranged on the side surface, the lower surface region is arranged apart from the joint region in a direction along the side, a length of the lower surface region in the direction is longer than a length of the joint region in the direction, a length of the side surface region in the direction is shorter than the length of the lower surface region in the direction, the side surface region is spaced apart from an end of the side surface in the direction, the electronic device is an image sensor, and the signal processing unit is configured to process a signal obtained by the electronic component, is provided.

Further features of the present invention will become apparent from the following description of exemplary embodiments (with reference to the attached drawings).

DESCRIPTION OF THE EMBODIMENTS

Figure 1A:
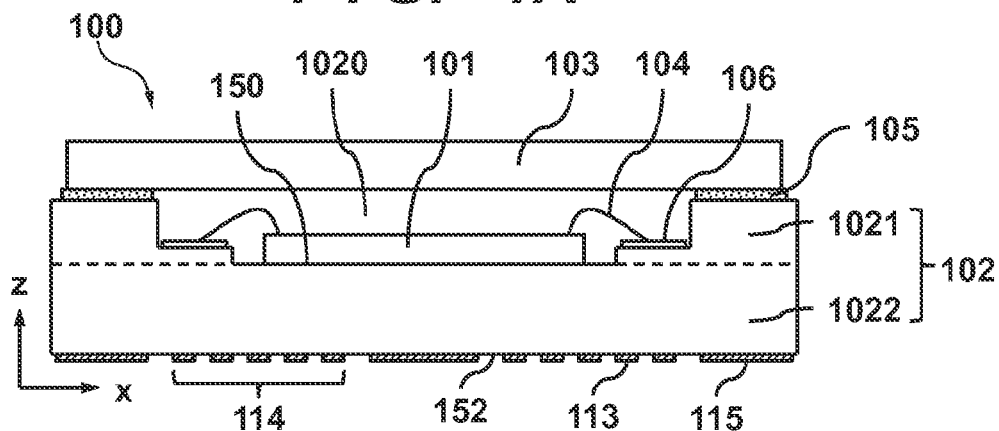
FIGS. 1A to 1C are schematic views each showing an electronic component according to an embodiment of the present invention.

A practical embodiment of an electronic component according to the present invention will be described below with reference to the accompanying drawings. Note that in the description and the drawings below, the same reference numerals denote the same constituent elements throughout the plurality of drawings. Therefore, the same constituent elements will be described with cross-reference to the plurality of drawings, and a description of the constituent elements denoted by the same reference numerals will be omitted as appropriate.

Figure 1B:
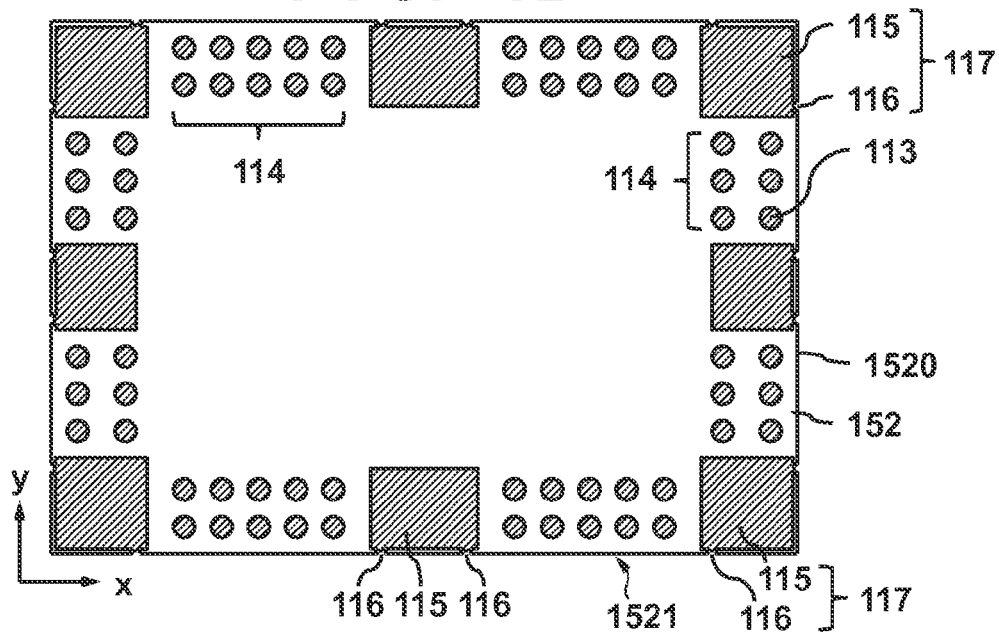
Figure 1C:
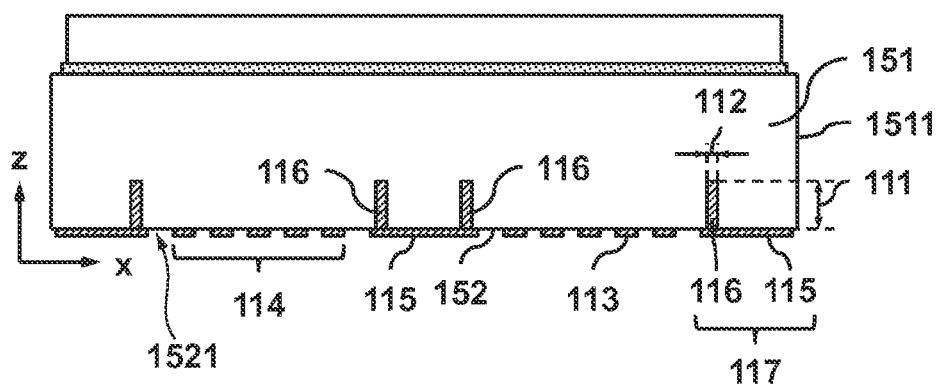

An example of the structure of an electronic component according to an embodiment of the present invention will be described with reference to FIGS. 1A to 1C and 2A to 2C. FIGS. 1A to 1C are schematic views each schematically showing an example of the arrangement of a surface mounted electronic component 100 according to a first embodiment of the present invention. Referring to FIGS. 1A to 1C, three directions intersecting each other (for example, three directions orthogonal to each other) are indicated by x, y, and z directions. In FIGS. 1A to 1C, the x direction indicates the long-side direction of the electronic component 100, the y direction indicates the short-side direction of the electronic component 100, and the z direction indicates the thickness direction of the electronic component 100. If the outer shape of the electronic component is a square, each of the x and y directions may be either of the sides of this plane. In this embodiment, both the outer shapes of the electronic component 100 and an electronic device 101 are a rectangle. The long-side and short-side directions of each of the electronic component 100 and electronic device 101 are set as the x and y directions, respectively.

FIG. 1A is a sectional view schematically showing an example of the arrangement of the electronic component 100. The electronic component 100 includes the electronic device 101, a mounted member 102, and a lid member 103. The electronic component 100 includes, on an upper surface 150 of the plate-shaped mounted member 102, a frame portion 1021 and a cavity portion 1020 surrounded by the frame portion 1021 to accommodate the electronic device 101. The electronic device 101 is arranged in the cavity portion 1020 on the upper surface 150. Internal terminals 106 are arranged inside the frame portion 1021 on the upper surface 150 of the mounted member 102. The internal terminals 106 and the electronic device 101 are electrically connected by connection conductors 104. Over the upper surface 150 of the mounted member 102, the lid member 103 facing the electronic device 101 is fixed to the frame portion 1021 by an adhesive material 105, and the cavity portion 1020 is sealed by the lid member 103. A lower surface 152 of the mounted member 102 is located on the opposite side of the upper surface 150. The mounted member 102 includes, on the side of the lower surface 152, a base portion 1022 supporting the frame portion 1021. Among surfaces forming the base portion 1022, a surface on the opposite side of the lower surface 152 is at least part of the upper surface 150 on which the electronic device 101 is mounted. In this embodiment, a case in which the mounted member 102 includes the base portion 1022 and the frame portion 1021 has been explained. However, the frame portion 1021 may be omitted and the internal terminals 106 may be provided in the base portion 1022.

The electronic device 101 and the internal terminals 106 are connected by wire bonding connection. In this case, metal wires (bonding wires) are used as the connection conductors 104. Furthermore, for example, flip chip connection or the like may be used to connect the electronic device 101 and the internal terminals 106, and conductive bumps may be used as the connection conductors 104. As a material forming the mounted member 102, a rigid board such as a glass epoxy board, composite board, glass composite board, Bakelite board, or ceramic board may be used. For example, in terms of the reliability and heat dissipation, a ceramic board may be used. Furthermore, for example, in terms of formation of a wiring layer, a laminated ceramic may be used. As a ceramic material, silicon carbide, aluminium nitride, sapphire, alumina, silicon nitride, cermet, yttria, mullite, forsterite, cordierite, zirconia, steatite, or the like may be used.

FIG. 1B is a bottom view showing the electronic component 100, and FIG. 1C is a side view showing the electronic component 100. As shown in FIG. 1B, first connection portions 113 for connecting the electronic component 100 to an external mounting board are arranged on the lower surface 152 of the mounted member 102. A plurality of external terminal groups 114 each of which is an aggregate of the first connection portions 113 is arranged on the lower surface 152. The lower surface 152 serves as a bonding surface including the plurality of first connection portions 113 and bonded to the mounting board by soldering to face the mounting board. The lower surface 152 is rectangular and includes edges 1520 including four sides. A side surface 151 shown in FIG. 1C shares a side 1521 of the four sides of the lower surface 152. Each first connection portion 113 has, on the lower surface 152, a joint region to be joined by soldering. In this embodiment, the joint region of each first connection portion 113 is formed by only a lower surface region arranged on the lower surface 152 of the mounted member 102. However, in addition to the joint region (lower surface region) arranged on the lower surface 152, each first connection portion 113 may include a joint region (side surface region) formed to extend from the lower surface 152 to the side surface 151 and arranged on the side surface 151. In this case, each first connection portion 113 may be joined to the mounting board by both the joint region (lower surface region) on the lower surface 152 and the joint region (side surface region) on the side surface 151. At least one first connection portion 113 of each external terminal group 114 may be arranged on only the lower surface 152, and joined to the mounting board. The following description assumes that each first connection portion 113 includes no side surface region and includes only the lower surface region, for the sake of convenience. If describing the shape and dimensions of each first connection portion 113, the shape and dimensions of the lower surface region of the first connection portion 113 are described.

In the mounted member 102, a plurality of second connection portions 117 is arranged apart from each other to be adjacent to the external terminal groups 114. Each second connection portion 117 includes, as joint regions to be joined by soldering, a lower surface region 115 arranged on the lower surface 152 of the mounted member 102 and side surface regions 116 arranged on the side surface 151. The lower surface region 115 and the side surface regions 116 are formed to be continuously connected. The length in the x or y direction of each first connection portion 113 is shorter than that in the x or y direction of the lower surface region 115.

Figure 2A:
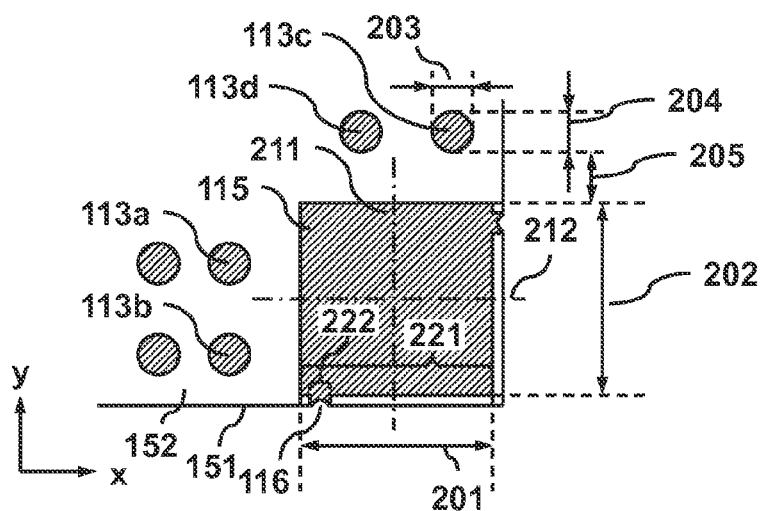
FIGS. 2A to 2C are enlargement views of FIG. 1B and modifications.

FIG. 2A is an enlarged view showing the shape of the lower surface region 115 of the second connection portion 117 of the electronic component 100, and boundaries 222 as portions where the lower surface region 115 and the side surface regions 116 are connected. FIG. 2A shows the lower surface region 115 of the second connection portion 117 arranged at a corner of the lower surface 152 shown in FIG. 1B and its neighboring region, and the lower surface region 115 is almost rectangular. The first connection portions 113 located near the second connection portion 117 are first connection portions 113a and 113b in a direction parallel to the x direction, and first connection portions 113c and 113d in a direction parallel to the y direction. Each boundary 222 as a portion where the lower surface region 115 and the side surface region 116 are connected to each other may be in contact with any position on a side 221 as a portion of the periphery of the lower surface region 115, which faces the side surface 151. The boundary 222 between the lower surface region 115 and the side surface region 116 may be arranged at a position near the first connection portion 113. This can effectively suppress a short-circuit with the first connection portion 113 due to excessive solder. Furthermore, the boundaries 222 may be respectively arranged in portions, connected to positions close to the first connection portions 113a to 113d near the lower surface region 115, of sides adjacent to the side surfaces 151 on the periphery of the lower surface region 115.

FIG. 2A shows a case in which the boundary 222 between the lower surface region 115 and the side surface region 116 is arranged at a position, close to the first connection portions 113a and 113b, on the side 221 facing the side surface 151 on the periphery of the lower surface region 115.

The length of the lower surface region 115 in the x direction is defined as a width 201, and the length of the lower surface region 115 in the y direction is defined as a width 202. The length of the first connection portion 113 in the x direction is defined as a width 203, and the length of the first connection portion 113 in the y direction is defined as a width 204. The length of each portion such as a connection portion or region indicates the longest one of the lengths of the portion in the respective directions. For example, if the first connection portion 113 is circular, the length in the x direction indicates the magnitude of the diameter of the first connection portion 113. The widths 201 and 202 of the lower surface region 115 may be larger than the widths 203 and 204 of the first connection portion 113 in at least one of the x and y directions in terms of the reliability, and the area of the lower surface region 115 may be larger than that of the first connection portion 113. Both the widths 201 and 202 of the lower surface region 115 may be larger than the widths 203 and 204 of the first connection portion 113. At a corner of the electronic component 100, a stress is not applied only in a specific direction but applied in various directions. Therefore, both the widths of the lower surface region 115 in the x and y directions may be made large.

A position at ½ the width 201 from the end of the lower surface region 115 in the x direction is defined as a center 211 of the lower surface region 115 in the x direction. Similarly, a position at ½ the width 202 from the end of the lower surface region 115 in the y direction is defined as a center 212 of the lower surface region 115 in the y direction. On the side 221 along the x direction, the boundary 222 may be arranged at a position closer to the first connection portions 113a and 113b than the center 211 of the lower surface region 115, as described above. On a side along the y direction, a portion connected to the side surface region 116 may be arranged at a position closer to the first connection portions 113c and 113d than the center 212 of the lower surface region 115.

If the electronic component 100 and the external mounting board are mounted using solder, there is the difference in thermal expansion coefficient between the mounted member 102 and the mounting board, and thus a stress may occur in solder due to the influences of a use status, an environment history such as a temperature cycle, and the like. As a result, a crack may occur in the solder, and the bonding may break. The second connection portion 117 including the lower surface region 115 whose area is larger than that of the first connection portion 113 is arranged to reinforce bonding between the mounted member 102 and the mounting board by soldering. The second connection portion 117 can contribute to not only reinforcement of bonding but also reduction in stress occurring in the first connection portion 113. The surfaces of the first connection portions 113 and the second connection portions 117 are made of a metal having high solder wettability using, for example, plating to obtain high adhesion with solder for connection to the external mounting board.

The internal terminal 106 and the first connection portion 113 are electrically connected to each other by internal wiring (not shown). The internal terminal 106 and the second connection portion 117 may be electrically connected to each other by internal wiring (not shown). However, the second connection portion 117 may not be electrically connected to the internal terminal 106, and may have only a mechanical connection function. The electronic device 101 is connected to the external mounting board via the connection conductors 104, internal terminals 106, internal wiring (not shown), and the first connection portions 113 or second connection portions 117, and is also electrically connected to another circuit element and the like.

In this embodiment, as shown in FIG. 1B, the 64 first connection portions 113 in total are arranged on the periphery of the lower surface 152 to form two rows along each side. The lower surface region 115 of the second connection portion 117 whose area is larger than that of the first connection portion 113 is arranged at each corner of the lower surface 152, and is also arranged at the center of each side, that is, the eight lower surface regions 115 in total are arranged. In this embodiment, the first connection portions 113 are regularly arranged in two rows along each side in the x and y directions but the arrangement of the first connection portions 113 is not limited to this. For example, the first connection portions 113 may be arranged in one row along each side, or may be arranged in three or more rows along each side. The number of rows may be different for each side. Furthermore, the first connection portions 113 may be arranged along only two sides in the x direction instead of being arranged along all the four sides. With respect to the arrangement of the second connection portions 117, the lower surface regions 115 may be arranged at only the corners of the lower surface 152, or arranged at only the centers of the respective sides. Note that a large stress is applied to solder at each corner of the lower surface 152 where the difference in thermal expansion coefficient between the mounted member 102 and the mounting board is most significant. Thus, the lower surface regions 115 of the second connection portions 117 may be arranged at at least two diagonal corners of the four corners of the lower surface 152.

The side surface region 116 of the second connection portion 117 will be described next. As shown in FIG. 1C, each side surface region 116 is continuously connected from the lower surface region 115, formed on the lower surface 152, of the second connection portion, and covers part of the side surface 151. The width 112 as the length of each side surface region 116 in the x direction is smaller than the width 201 (see FIG. 2A) as the length of the lower surface region 115 in the x direction. In addition, as shown in FIG. 1C, each side surface region 116 is arranged apart from an end 1511 of the side surface 151. For example, the end 1511 of the side surface 151 parallel to the x direction indicates a portion in which the side surface 151 is not parallel to the x direction any more. The same applies to the end of a side surface parallel to another direction (for example, the y direction). Referring to FIG. 1B, the end 1511 of the side surface 151 is a side extending from the corner of the lower surface 152 in the z direction. The side surface region 116 extends from the boundary 222 as a portion connected to the lower surface region 115 along the side surface 151 of the mounted member 102 in the z direction. In this embodiment, FIG. 1C exemplifies the four side surface regions 116. Among them, the leftmost and rightmost side surface regions 116 are connected from the lower surface regions 115 of the second connection portions 117 arranged at the corners of the lower surface 152. The two central side surface regions 116 are connected from the lower surface region 115 of the second connection portion 117 arranged at the center of the side of the lower surface 152. The first connection portions 113 are close to the two central side surface regions 116 on the right and left sides of the lower surface region 115 in the x direction. Therefore, the side surface regions 116 connected to the lower surface region 115 are arranged at positions close to the first connection portions 113 on both sides of the lower surface region 115.

When soldering the electronic component 100 and the mounting board, solder paste is printed on the first connection portions 113 and the lower surface regions 115 of the second connection portions 117 or the connection portions of the external mounting board facing the first connection portions 113 and the lower surface regions 115 of the second connection portions 117. In this case, solder paste of an amount roughly corresponding to the area of each connection portion is printed. The effect of reinforcement of solder connection by the lower surface region 115 of the second connection portion 117 improves by printing a large amount of solder paste on the lower surface region 115 having a large area, as compared with the amount of solder paste on the first connection portion 113. After printing solder paste, the electronic component 100 and the mounting board are overlaid on each other, and heated by a solder melting method such as a reflow method. By heating, solder is melted and squeezed by the weight of the electronic component 100. After a cooling process, solder joints are completed.

In the process of heating and melting solder, since solder paste has been printed on the large area of the lower surface region 115 of the second connection portion 117, solder is squeezed and tends to be excessive, as compared with the first connection portion 113. In this case, if there is no side surface region 116 connected from the lower surface region 115 to the side surface 151 in the second connection portion 117, solder flowing out cross the edge of the lower surface region 115 tends to spread, thereby causing a short-circuit with the adjacent first connection portion 113. If the solder which has flown out is scattered outside the electronic component 100 and the mounting board, this may cause contamination in a manufacturing apparatus for performing heating. Consequently, the manufacturing yield and productivity may decrease.

In this embodiment, each second connection portion 117 includes the side surface region 116 connected to the lower surface region 115. The excessive solder squeezed out from the lower surface region 115 flows into the side surface region 116, thereby preventing a short-circuit between connection portions and preventing the solder from being scattered outside the mounting board. Meanwhile, if the width 112 of the side surface region 116 is set to a value equal to or larger than the width 201 of the lower surface region 115, the amount of solder flowing into the side surface region 116 becomes large. As a result, as compared with the amount of solder originally required for a joint, a large amount of solder needs to be coated to the lower surface region 115 before heating by the reflow method or the like. Therefore, when melting solder, the amount of excessive solder increases, thereby causing a short-circuit with the adjacent first connection portion 113. If the second connection portion 117 and the first connection portion are arranged apart from each other to prevent a short-circuit between the connection portions, the effect of reinforcement of solder connection of the second connection portion 117 to the first connection portion may decrease. In this design, it is also difficult to downsize the electronic component.

Meanwhile, excessive solder can enter the side surface region 116 from the lower surface region 115 by making the width 112 of the side surface region 116 smaller than the width 201 of the lower surface region 115. This prevents the excessive solder from spreading out, and thus it is possible to reduce a short-circuit failure between the first connection portion 113 and the lower surface region 115 of the second connection portion 117, which is caused when the excessive solder spreads out. At the same time, it is possible to prevent a problem in the process caused when the excessive solder is scattered in the apparatus. If the side surface region 116 is connected to the lower surface region 115 near the first connection portion 113, excessive solder occurring in a region near the first connection portion 113 of the lower surface region 115 enters the side surface region 116 and adheres to it. Therefore, it is possible to further improve the short-circuit prevention effect.

Furthermore, the lengths of the side surface region 116 in the x and y directions are shorter than those of the lower surface region 115, and the side surface region 116 extends from part of the lower surface region 115. If the plurality of side surface regions 116 is arranged in one lower surface region 115, they are spaced apart from each other. Therefore, only excessive solder enters the side surface regions 116, and solder necessary to connect the electronic component 100 and the mounting board remains in the lower surface region 115. In this case, the solder members adhere to the entire surfaces of the lower surface regions 115 of the second connection portions 117 and the first connection portions 113. As a result, it is possible to maintain the strength necessary to connect the mounted member 102 and the mounting board against a stress caused by the difference in thermal expansion coefficient between the mounted member 102 and the mounting board. These effects improve the manufacturing yield and the reliability of a module to be manufactured.

It is possible to control and optimize the amount of excessive solder by designing, as needed, a height 111 and the width 112 of the side surface region 116 of the second connection portion 117 in accordance with the gross weight of the electronic component 100 and the area of the lower surface region 115 of the second connection portion 117. In this embodiment, the two side surface regions 116 connected to the one lower surface region 115 of the second connection portion 117 are provided, but the number of side surface regions 116 is not limited to this. The number of side surface regions 116 connected to the one lower surface region 115 may be one, or three or more. The number can be set, as needed, in accordance with the estimated value of the amount of excessive solder. Furthermore, the side surface region 116 may be formed to have a large surface area. As the surface area of the side surface region 116 increases, it becomes easy to absorb a larger amount of excessive solder. For example, as shown in FIG. 1B in this embodiment, the side surface 151 may have a groove extending from the side of the lower surface 152, and the side surface region 116 may be formed in the groove. In this embodiment, as shown in FIG. 1B, the side surface region 116 is formed to have an arc-shaped cross section. However, the shape of the side surface region 116 may be a rectangle or trapezoid.

In addition, since it is possible to control the amount of excessive solder by providing the side surface region 116 connected to the lower surface region 115, it is easy to increase the area of the lower surface region 115 without increasing the distance between the first connection portion 113 and the lower surface region 115. It is possible to provide an electronic component with high reliability against thermal shock by increasing the area of the lower surface region 115 while keeping it close to the first connection portion 113.

Although a case in which an LGA (Land Grid Array) is used as the first connection portion 113 has been explained in this embodiment, an LCC (Leadless Chip Carrier) or the like may be used. Alternatively, an LGA and LCC may be used together. In the mode shown in FIG. 1B, the arrangement region of the external terminal groups 114 each of which is an aggregate of the first connection portions 113 is divided into eight regions by the lower surface regions 115 of the second connection portions 117. However, the arrangement of the connection portions is not limited to this.

Figure 2B:
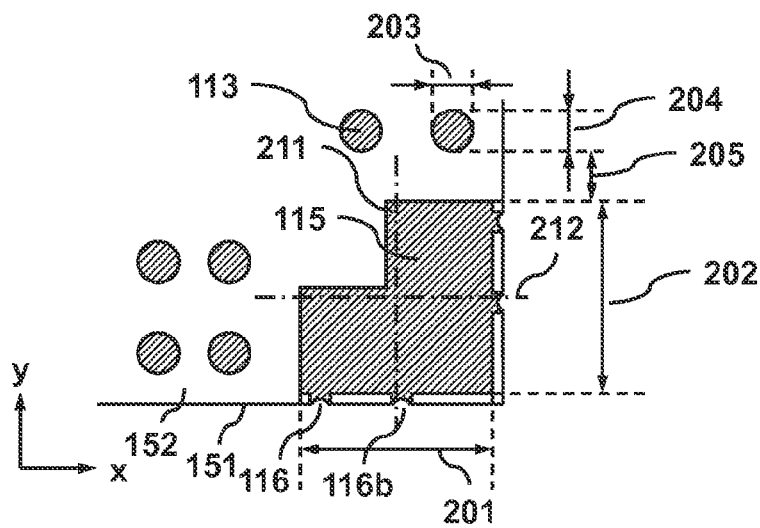

The shape of the lower surface region 115 of the second connection portion 117 is not limited to the rectangle shown in FIGS. 1B and 2A. The rectangle may have rounded corners, or a circular shape may be adopted. FIG. 2B shows a case in which the lower surface region 115 has an L shape. In addition, this example is not intended to limit the number of the side surface regions 116 and their positions. In this embodiment, as shown in FIG. 1B, the lower surface region 115 of the second connection portion 117 is spaced apart from the edge 1520 of the lower surface 152 except for portions connected to the side surface regions 116. However, for example, the lower surface region 115 may be in contact with the edge 1520 of the lower surface 152.

Referring to FIG. 2B, a side surface region 116b is arranged at a position at which the distance between the side surface region 116b and the closest first connection portion 113 is equal to or longer than that between the center of a side of the lower surface region 115 connected to the side surface region 116b and the closest first connection portion 113.

Figure 2C:
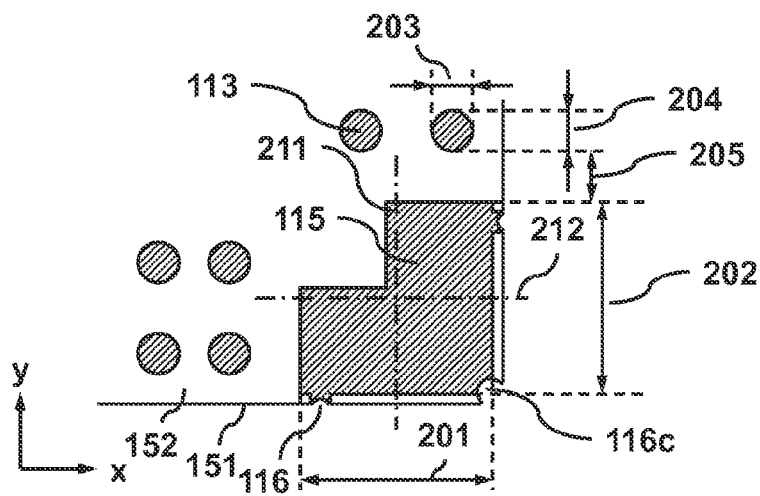

FIG. 2C shows a case in which the second connection portion 117 arranged at the corner of the lower surface 152 further includes a side surface region 116c connected to the lower surface region 115 at the corner of the lower surface 152 in addition to the above-described side surface regions 116 spaced apart from the ends of the side surfaces. For example, the side surface region 116c may be arranged between the ends of the adjacent side surfaces. If the lower surface region 115 is arranged at the corner of the lower surface 152, solder tends to be excessive at the corner of the lower surface 152. To cope with this, in addition to the side surface regions 116 spaced apart from the ends of the side surfaces near the first connection portions 113, the side surface region 116c is arranged at the corner of the lower surface 152. By arranging the lower surface region 115 connected to the side surface region 116c formed in a groove between the ends of the side surfaces at the corner of the lower surface 152, excessive solder enters the side surface region 116c and adheres to it, thereby forming a fillet. It is possible to strengthen solder connection between the electronic component 100 and the external mounting board by forming a fillet at a corner of the rectangular shape to which a stress is applied most. It becomes easier to control excessive solder by arranging the side surface region 116c at the corner of the lower surface 152. The shape between the ends of the adjacent side surfaces at the corner of the lower surface 152 may be a groove structure as in this embodiment, or may be, for example, a round shape. Note that the locations where the lower surface region 115 and the side surface regions 116 are connected and the shapes, numbers, and positions of lower surface regions 115 and side surface regions 116 are not limited to those in this embodiment. The shapes, numbers, and positions of side surface regions 116 and lower surface regions 115 of the second connection portions 117 can be set, as needed. In this embodiment, the shape of each first connection portion 113 is a circular shape but is not limited to this and may be, for example, a rectangular shape. The shape of each first connection portion 113, the number of first connection portions 113, and the positions of the first connection portions 113 can be set, as needed.

The widths 201 and 202 of the lower surface region 115 of the second connection portion 117 may be twice or more a distance 205 between the lower surface region 115 and the first connection portion 113 which are adjacent to each other. In this embodiment, even if the lower surface region 115 is increased, it is possible to appropriately control excessive solder, and thus shorten the distance between the first connection portion 113 and the second connection portion 117. This can manufacture an electronic component with higher reliability against thermal shock. Furthermore, the widths 201 and 202 of the lower surface region 115 of the second connection portion 117 may be larger than the distance between the adjacent first connection portions 113. The distance between the side surface region 116 or 116b and the end of the side surface may be larger than that between the adjacent first connection portions 113.

Figure 3:
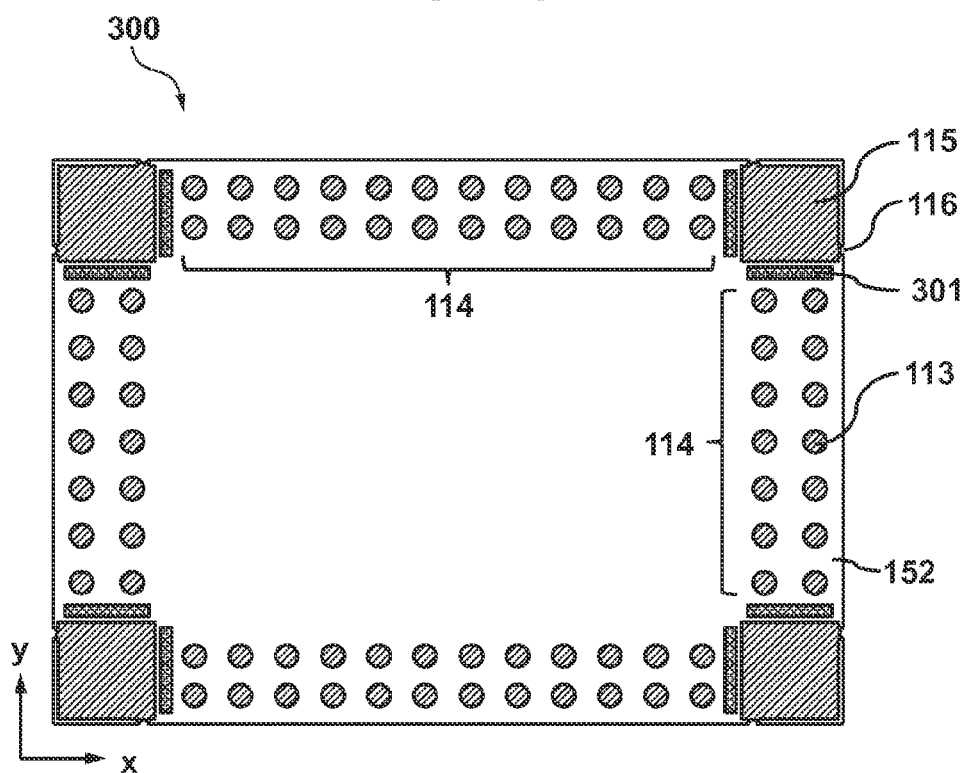
FIG. 3 is a bottom view showing an electronic component according to another embodiment of the present invention.

The structure of a surface mounted electronic component 300 according to a second embodiment of the present invention will be described with reference to FIG. 3. FIG. 3 is a schematic bottom view showing the electronic component 300 according to the second embodiment of the present invention. The electronic component 300 is different from the electronic component 100 in that a step portion 301 is arranged between an external terminal group 114 as an aggregate of first connection portions 113 and a lower surface region 115 of a second connection portion 117 but other points may be the same. A repetitive description of the same constituent elements as those of the electronic component 100 will be omitted.

In the electronic component 300 according to this embodiment, the 76 first connection portions 113 in total are arranged in two rows along each side in the peripheral portion of a lower surface 152. The lower surface region 115 of the second connection portion 117 whose area is larger than that of the first connection portion 113 is arranged at each corner of the lower surface 152, that is, the four lower surface regions 115 in total are arranged. One step portion 301 is arranged between each external terminal group 114 and each lower surface region 115, that is, the eight step portions 301 in total are arranged. Each step portion may have a convex or concave shape with respect to the lower surface 152.

The effect of the step portion 301 will be explained. When connecting the electronic component 300 and a mounting board by soldering, if excessive solder is squeezed, and then wets and spreads in a reflow process of heating and melting solder, a surface tension generated in the edge portion of the step portion 301 suppresses spreading of excessive solder. Excessive solder in the lower surface region 115 effectively enters a side surface region 116 from the lower surface region 115 without wetting and spreading toward the first connection portion 113. This can further reduce a short-circuit caused by excessive solder or the problem caused by scattered solder, as compared with the electronic component 100. As a result, it is possible to improve the manufacturing yield and productivity.

It is possible to form a concave step in the step portion 301 by, for example, forming a groove in part of the lower surface 152 of a mounted member 102. It is also possible to form a concave step by forming a resist layer on the lower surface 152, and removes part of the resist layer. Meanwhile, it is possible to form a convex step by, for example, adhering and arranging a band-like member on the lower surface 152. It is also possible to form a convex step by partially forming a resist layer on the lower surface 152. As a method of obtaining more sufficient spreading suppression by the edge of the step portion 301, a concave groove may be formed as a step. Meanwhile, to control the amount of squeezed excessive solder, it is possible to control the distance between the electronic component 100 and the mounting board by the height of a convex shape by forming a convex step. That is, it is possible to use the convex step as a spacer. The height of the step portion may be equal to or larger than 10 μm. Furthermore, the height of the step portion may be equal to or larger than 30 μm. If the step has a height of 10 μm or more, the excessive solder stops at the edge of the step portion 301, and thus it can be expected to obtain the effect of the step portion 301.

Although the two embodiments of the present invention have been explained above, the present invention is not limited to this. The above-described embodiments can be changed, combined, and shared, as needed. The electronic component according to each of the above-described embodiments is electrically connected to the external mounting board by soldering in the reflow process using solder paste. When the electronic component 100 according to the embodiment is secondarily mounted on the mounting board, it forms a module together with the external mounting board. If the electronic device 101 according to the embodiment is a solid-state image sensor including a CCD or CMOS image sensor, the electronic component 100 serves as an image capturing apparatus. It is possible to mount the above-described module on various electronic components. In an electronic apparatus, the mounting board of the module is fixed to the housing of the electronic apparatus. The electronic apparatus can be an information terminal such as a computer or smartphone, an image sensing apparatus such as a digital camera, or a display device such as a television set. If the electronic component 100 is an image capturing apparatus, it is possible to implement an electronic apparatus having an image sensing function. The electronic component according to the embodiment can reduce a short-circuit caused by excessive solder or the problem in the process caused by scattered solder at the time of secondary mounting. This makes it possible to manufacture a module with a low failure occurrence rate at the time of mounting, and improve the productivity.

As an application of the electronic apparatus including a module mounted with the electronic component according to each of the above embodiments, a camera incorporating the module will be exemplified. The camera conceptually includes not only an apparatus whose principal purpose is shooting but also an apparatus (for example, a personal computer or portable terminal) additionally provided with a shooting function. The camera may be, for example, a module component such as a camera head. The camera includes the module obtained by mounting, on the mounting board, the electronic component according to the present invention exemplified as the above-mentioned embodiment, and a signal processing unit for processing an output signal from the electronic component. This signal processing unit can include, for example, a processor for processing digital data based on the signal obtained from the electronic component. An A/D converter for generating this digital data can be provided on the semiconductor board of the electronic component or another semiconductor board.

An example will be described below. An electronic component 100 shown in FIGS. 1A to 1C according to the first embodiment was manufactured. The electronic component had a rectangular shape with a long-side direction as an x direction and a short-side direction as a y direction. In the following description, numerical values are set to appropriate ones to obtain the effects of the present invention. Therefore, the magnitude relationships between the sizes of respective parts grasped from the numerical values described below constitute part of the present invention without explicitly describing the magnitude relationships between the sizes.

A rectangular concave ceramic package obtained by stacking seven alumina ceramic layers was prepared as a mounted member 102. The mounted member 102 had a total thickness of 3.7 mm. The thickness from a surface on which an electronic device 101 of the mounted member 102 was arranged to a lower surface 152, that is, the thickness of a base portion 1022 was 2.0 mm, and the thickness of a frame portion 1021 was 1.7 mm. The outer shape of the mounted member 102 in the x direction had 52.0 mm, and the outer shape of the mounted member 102 in the y direction had 40.0 mm. First connection portions 113 of the lower surface 152 were of an LGA type and arranged in two rows along each side, and had a pattern size of ϕ1.0 mm and a pitch of 1.8 mm. According to the first embodiment, FIG. 1B shows the 64 first connection portions 113 in total. In this example, it was possible to arrange the 144 first connection portions 113. Eight lower surface regions 115 of second connection portions 117 in total were arranged at the four corners and the centers of the respective sides of the lower surface 152, similarly to FIG. 1B in the first embodiment. The lower surface region 115 had a width 201 of 4.35 mm in the x direction and a width 202 of 2.7 mm in the y direction. In this case, the area of each lower surface region 115 was about 11.7 mm$^2$, the area of each first connection portion 113 was 0.79 mm$^2$, and thus the area of the lower surface region 115 was sufficiently larger than that of the first connection portion 113.

In the lower surface region 115 at each corner of the lower surface 152, a side surface region 116 which was connected from the lower surface region 115 and covered part of a side surface 151 was arranged in each of the x and y directions at a position near the first connection portion 113. The side surface region 116 was a groove having a concave arc shape in a planar view with respect to the lower surface 152. In this case, only the side surface region 116 in the x direction will be described in detail. The distance between the center of the closest first connection portion 113 and the center line of the side surface region 116 was designed to be 2.0 mm in a direction parallel to the x direction. With respect to the other side surface region 116, the distance between the center of the closest first connection portion 113 and the center line of the side surface region 116 was designed to be almost 2.0 mm in a direction parallel to the side surface 151 on which the side surface region 116 existed. Each side surface region 116 had a height 111 of 1.0 mm and a width 112 of 0.6 mm. That is, the height 111 of the side surface region 116 was about half the thickness of the base portion 1022 without providing the side surface region 116 in the frame portion 1021.

A tungsten material was used for the internal layer wiring pattern of the mounted member 102. In the structure of each of the first connection portions 113 and the lower surface regions 115 and side surface regions 116 of the second connection portions 117, an underlayer was formed using a tungsten material to have a thickness of about 10 µm, and a nickel layer having a thickness of about 5 µm was formed on the underlayer by electrolytic nickel plating. In addition, electrolytic gold plating processing of forming gold plating having a thickness of 0.5 µm on the nickel layer was performed.

A CMOS image sensor having 42 mm in the x direction, 31 mm in the y direction, and a thickness of 0.78 mm was used as the electronic device 101. The electronic device 101 was mounted in a cavity portion 1020 of the mounted member 102 using general die bond paste. The electronic device 101 and internal terminals 106 of the mounted member 102 were electrically connected by connection conductors 104. Furthermore, quartz was selected for a lid member 103, and the lid member 103 was adhered above the mounted member 102 using a UV adhesive material as an adhesive material 105 to face the electronic device 101. Based on the above example, 20 electronic components 100 according to the present invention were manufactured.

Figure 4:
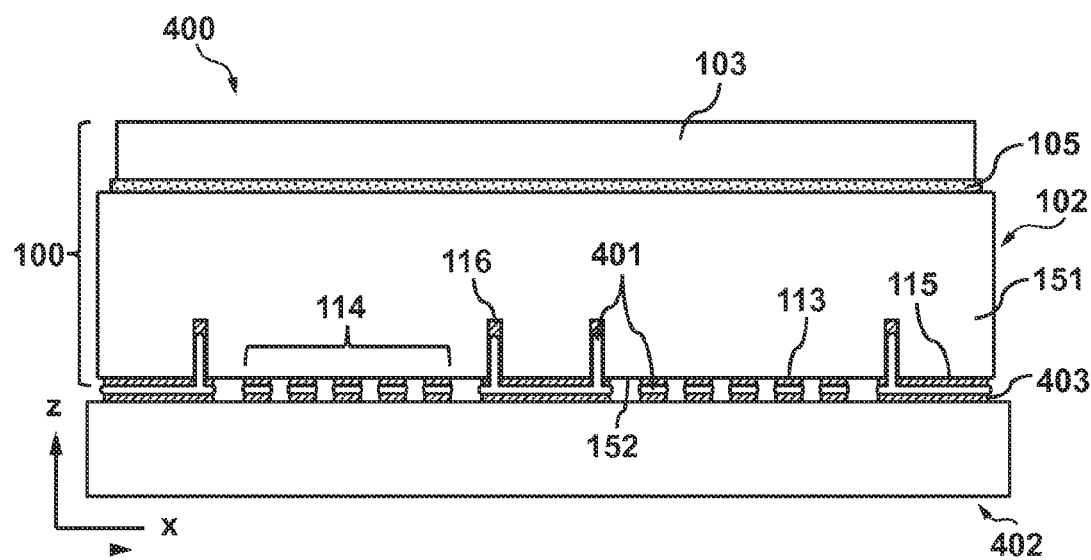
FIG. 4 is a side view showing a module according to an example of the present invention.

Next, an external mounting board 402 serving as a secondary mounting board in which a solder paste pattern was arranged on a mount surface was prepared to face the first connection portions 113 and lower surface regions 115. On connection portions 403 on the mount surface of the mounting board 402, Sn—Bi-based solder paste having a melting point as low as about 140° C. was coated by screen printing. After that, the electronic component 100 according to the present invention was mounted on the mount surface of the mounting board 402 to perform a reflow process. With this process, the solder paste served as solder members 401 to electrically join the connection portions 403 of the mounting board 402 and the first connection portions 113 and the lower surface regions 115 of the second connection portions 117 of the mounted member 102. In this way, 20 modules 400 according to the present invention were manufactured. FIG. 4 is a side view showing each module 400.

In the manufactured module 400, the thickness of each of the solder members 401 between the connection portions 403 and the first connection portions 113 and the lower surface regions 115 of the second connection portions 117 was about 0.2 mm. It could be confirmed that the solder members 401 of the lower surface regions 115 entered the side surface regions 116 and adhered to them. When the joint conditions of the solder members 401 of the module 400 according to the present invention was confirmed using an X-ray inspection apparatus, no short-circuits of the solder members 401 between the first connection portions 113 or between the first connection portions 113 and the lower surface regions 115 of the second connection portions 117 were confirmed.

Figure 5A:
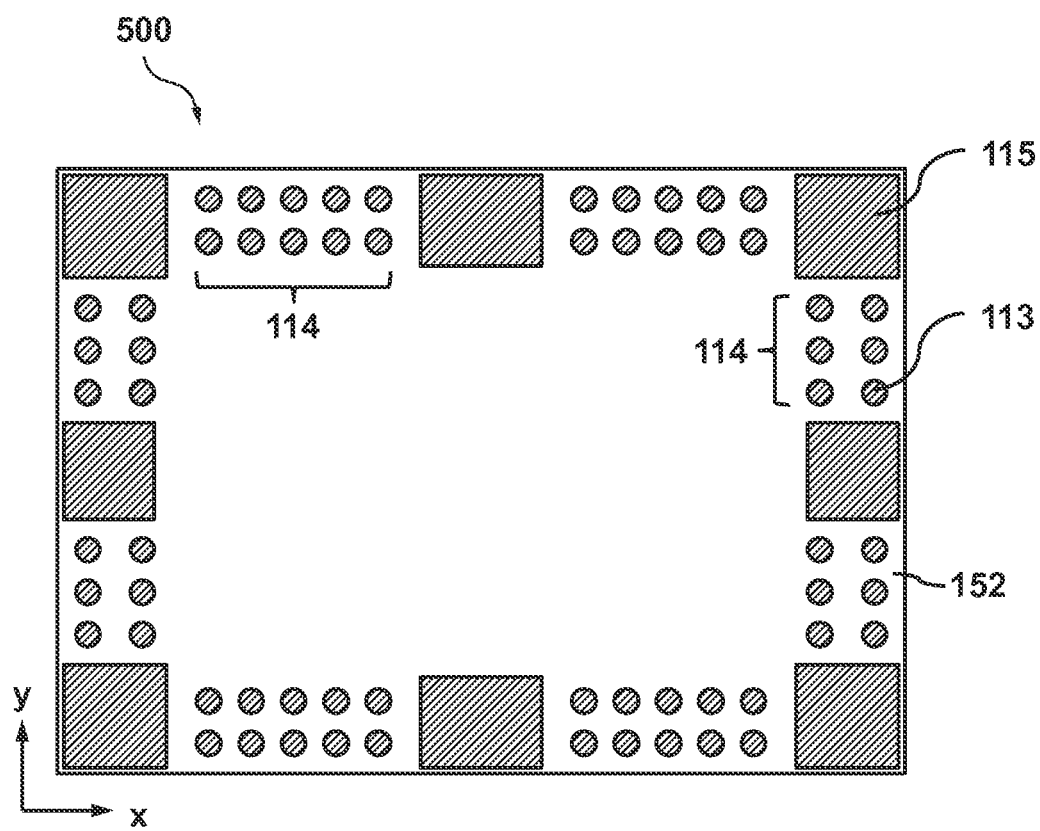
FIGS. 5A and 5B are bottom views each showing an electronic component according to a comparative example.
Figure 5B:
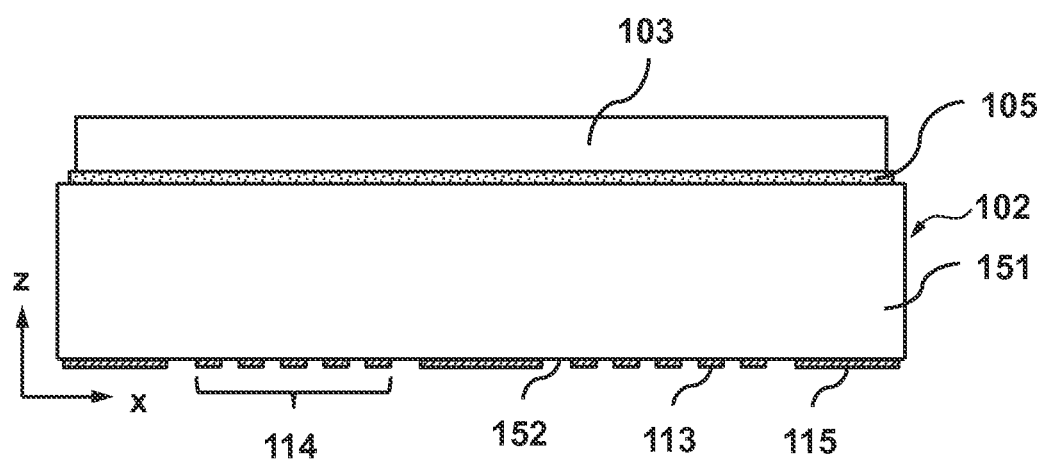

As a comparative example, 20 electronic components 500 each shown in FIGS. 5A and 5B were manufactured, and comparative modules in each of which the electronic component 500 was mounted on the mount surface of a mounting board were manufactured. As shown in FIGS. 5A and 5B, the electronic component 500 according to the comparative example is different from the electronic component 100 according to the embodiment of the present invention in that no side surface region 116 connected to a lower surface region 115 and extending to a side surface 151 is provided in each second connection portion 117, and was manufactured in the same manner except for the side surface region 116.

When the joint conditions of the solder members of the modules each mounted with the electronic component 500 according to the comparative example were confirmed using an X-ray inspection apparatus, nine short-circuits, in total, between first connection portions 113 and the lower surface regions 115 of the second connection portions 117 are confirmed in four of the 20 manufactured modules.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-216633, filed Oct. 23, 2014, which is hereby incorporated by reference wherein in its entirety.

What is claimed is:

1. A surface mounted electronic component including a first connection portion and a second connection portion, each of the first connection portion and the second connection portion having a solder wettability for a connection to a mounting board, comprising:
an upper surface on which an electronic device is mounted;
a lower surface located on an opposite side of the upper surface; and
side surfaces each configured to share a side with the lower surface, wherein
the first connection portion includes a joint region arranged on the lower surface,
the second connection portion includes a lower surface region arranged on the lower surface, and a side surface region connected to the lower surface region and arranged on one side surface of the side surfaces, the one side surface sharing one side of four sides with the lower surface,
the lower surface region is arranged apart from the joint region in a direction along the one side,
a length of the lower surface region in the direction is longer than a length of the joint region in the direction,
a length of the side surface region in the direction is shorter than the length of the lower surface region in the direction, and the side surface region is spaced apart from both ends of the one side surface in the direction.

2. The component according to claim 1, wherein the first connection portion is arranged on the lower surface apart from the four sides.

3. The component according to claim 1, wherein
the joint region and the lower surface region are adjacent to each other, and
the length of the lower surface region in the direction is not less than twice a distance between the joint region and the lower surface region.

4. The component according to claim 1, wherein
the component comprises a plurality of first connection portions each including the joint region, and
the length of the lower surface region in the direction is longer than a distance between the joint regions of the adjacent first connection portions.

5. The component according to claim 1, wherein a part of a periphery of the lower surface region, the part being along the direction and not being connected to the side surface region, is spaced apart from the one side.

6. The component according to claim 1, wherein
the component comprises a plurality of first connection portions each including the joint region, and
a distance between the joint regions of the adjacent first connection portions is shorter than a distance between the side surface region and one of the both ends of the one side surface.

7. The component according to claim 1, wherein
the one side surface has a groove extending from the one side, and
the side surface region is arranged in the groove.

8. The component according to claim 1, wherein
the lower surface region includes a center where a position at half a maximum width of the lower surface region from an end of the lower surface region in the direction, and a first boundary portion where the lower surface region is connected to the side surface region, and
in the direction, a distance between the first boundary portion and the first connection portion is shorter than a distance between the center and the first connection portion.

9. The component according to claim 1, wherein
the side surface region arranged apart from the both ends of the one side surface is a first side surface region,
the second connection portion further includes a second side surface region connected to the lower surface region and arranged on the one side surface,
a width of the second side surface region in the direction is smaller than a width of the lower surface region in the direction,
the lower surface region includes a second boundary portion where the lower surface is connected to the second side surface region.

10. The component according to claim 8, wherein
the second connection portion further includes a third side surface region connected to the lower surface region and arranged on a side surface of the side surfaces, and
a portion where the lower surface region and the third side surface region are connected to each other is arranged at a corner of the lower surface.

11. The component according to claim 1, wherein the second connection portion is arranged at each of two diagonal corners of the lower surface.

12. The component according to claim 1, wherein the component further comprises a step portion between the first connection portion and the lower surface region.

13. The component according to claim 1, wherein the electronic device is an image sensor.

14. The component according to claim 1, wherein
a distance between the side surface region and one of the both ends is shorter than the length of the lower surface region in the direction.

15. The component according to claim 1, wherein
distances between the side surface region and each of the both ends are longer than the length of the lower surface region in the direction.

16. The component according to claim 1, wherein
in a direction perpendicular to the lower surface, a length of the side surface region is not more than half a length of the one side surface.

17. The component according to claim 1, wherein
the one side surface has, between the side surface region and one of the both ends in the direction, a surface of a ceramic material.

18. The component according to claim 1, wherein
the side surface region arranged apart from the both ends of the one side surface is a first side surface region,
the second connection portion further includes a fourth side surface region connected to the lower surface region and arranged on an other side surface of the side surfaces,
the other side surface shares an other side of the four sides with the lower surface,
the one side and the other side constitute a corner of the component, and
a width of the fourth side surface region in a direction along the other side is smaller than a width of the lower surface region in the direction along the other side.

19. A module comprising:
a mounting board;
a surface mounted electronic component including a first connection portion and a second connection portion; and
a solder member, wherein
the surface mounted electronic component comprises:
an upper surface on which an electronic device is mounted;
a lower surface located on an opposite side of the upper surface; and
side surfaces each configured to share a side with the lower surface,
the first connection portion includes a joint region arranged on the lower surface,
the second connection portion includes a lower surface region arranged on the lower surface, and a side surface region connected to the lower surface region and arranged on one side surface of the side surfaces, the one side surface sharing one side of four sides with the lower surface,
the lower surface region is arranged apart from the joint region in a direction along the one side,
a length of the lower surface region in the direction is longer than a length of the joint region in the direction,
a length of the side surface region in the direction is shorter than the length of the lower surface region in the direction,
the side surface region is spaced apart from both ends of the one side surface in the direction,
the solder member is configured to connect the first connection portion and the second connection portion of the electronic component to connection portions of a mount surface of the mounting board, and part of the solder member adheres to the side surface region.

20. A camera comprising:

a mounting board;

a surface mounted electronic component including a first connection portion and a second connection portion connected to the mounting board;

a solder member; and a signal processing unit, wherein the surface mounted electronic component comprises:

an upper surface on which an electronic device is mounted;

a lower surface located on an opposite side of the upper surface; and side surfaces each configured to share a side with the lower surface, the first connection portion includes a joint region arranged on the lower surface, the second connection portion includes a lower surface region arranged on the lower surface, and a side surface region connected to the lower surface region and arranged on one side surface of the side surfaces, the one side surface sharing one side of four sides with the lower surface, the lower surface region is arranged apart from the joint region in a direction along the one side, a length of the lower surface region in the direction is longer than a length of the joint region in the direction, a length of the side surface region in the direction is shorter than the length of the lower surface region in the direction, the side surface region is spaced apart from both ends of the one side surface in the direction, the electronic device is an image sensor, the solder member is configured to connect the first connection portion and the second connection portion of the electronic component to connection portions of a mount surface of the mounting board, and the signal processing unit is configured to process a signal obtained by the electronic component.

\* \* \* \* \*